(12) United States Patent
Tan et al.

(10) Patent No.: US 8,008,128 B2
(45) Date of Patent: Aug. 30, 2011

(54) THIN QUAD FLAT PACKAGE WITH NO LEADS (QFN) FABRICATION METHODS

(75) Inventors: Xiaochun Tan, Shanghai (CN); Zhining Li, Shanghai (CN); Xaiolan Jiang, Shanghai (CN)

(73) Assignee: Shanghai Kaihong Technology Co., Ltd., Shanghai (CN)

( * ) Notice: Subject to any disclaimer, the term of this patent is extended or adjusted under 35 U.S.C. 154(b) by 0 days.

(21) Appl. No.: 12/728,914

(22) Filed: Mar. 22, 2010

(65) Prior Publication Data

US 2010/0178733 A1 Jul. 15, 2010

Related U.S. Application Data

(63) Continuation of application No. 12/109,635, filed on Apr. 25, 2008, now Pat. No. 7,713,784.

(30) Foreign Application Priority Data

Mar. 13, 2008 (CN) .......................... 2008 1 0034572

(51) Int. Cl.
*H01L 21/00* (2006.01)
(52) U.S. Cl. ........ 438/112; 257/100; 257/433; 257/667; 257/787
(58) Field of Classification Search .................. None
See application file for complete search history.

(56) References Cited

U.S. PATENT DOCUMENTS

| | | | |
|---|---|---|---|
| 6,258,314 B1 | 7/2001 | Oida et al. | |
| 6,395,585 B2 | 5/2002 | Brandl | |
| 6,608,366 B1 | 8/2003 | Fogelson et al. | |
| 6,858,470 B1 | 2/2005 | Han et al. | |
| 7,091,596 B2 | 8/2006 | Han et al. | |
| 7,413,927 B1* | 8/2008 | Patwardhan et al. | 438/108 |
| 7,713,784 B2* | 5/2010 | Tan et al. | 438/112 |
| 2003/0141577 A1* | 7/2003 | Hung et al. | 257/676 |
| 2004/0121514 A1* | 6/2004 | Yoo et al. | 438/106 |
| 2005/0189658 A1* | 9/2005 | Xiaochun et al. | 257/782 |
| 2007/0155049 A1* | 7/2007 | Tsai | 438/106 |
| 2008/0009103 A1* | 1/2008 | Xiaochun et al. | 438/127 |
| 2008/0014677 A1* | 1/2008 | Xiaochun et al. | 438/106 |

* cited by examiner

*Primary Examiner* — Ha Tran T Nguyen
*Assistant Examiner* — Shantanu C Pathak
(74) *Attorney, Agent, or Firm* — Chad R. Walsh; Fountainhead Law Group PC

(57) ABSTRACT

Embodiments of the present invention include a method of packaging semiconductor devices. The method comprises the steps of molding a surface of a wafer, sawing the wafer into individual devices, attaching the individual semiconductor device to an adhesive surface, molding the exposed surface, and sawing the wafer into individual semiconductor devices. The step of molding forms a continuous molded layer. The step of sawing results in each individual semiconductor having a molded layer. This molded layer corresponds to a portion of the continuous molded layer. The step of attaching includes attaching the molded layer of the individual semiconductor devices to the adhesive surface. The step of molding the exposed area includes molding an exposed area above the adhesive surface. This forms a solid expanse of material. The step of sawing the wafer into individual semiconductor devices includes sawing the solid expanse of material.

9 Claims, 2 Drawing Sheets

THIN QUAD FLAT PACKAGE WITH NO LEADS (QFN) FABRICATION METHODS

CROSS REFERENCE TO RELATED APPLICATIONS

The present application is a continuation of, and claims priority to, U.S. patent application Ser. No. 12/109,635, filed on Apr. 25, 2008, which claims priority to Chinese Patent Application No. 200810034572.6, filed Mar. 13, 2008, naming Xiaochun Tan, Zhining Li, and Xiaolan Jiang as inventors, both of which are incorporated herein by reference in their entirety for all purposes.

BACKGROUND

The present invention relates to semiconductor package fabrication processes, and in particular, to thin quad flat package no leads (QFN) fabrication methods.

Consumers are demanding that devices such as cell phones, personal digital assistants, and music players be more reliable, compact, and affordable. For example, consumers are requiring that their cell phones be ultra thin and reliable. This requires thinner packaging and fewer defects. Additionally, these low profile applications may also require power electronics which require some level of thermal dissipation from the package. Of course, these package features need to be available at an affordable price.

Present QFN packages are fabricated using standard methods using a lead frame and a die attach pad. These methods limit the thinness of the device and may introduce additional process elements which may be an additional source of potential defects. These additional process elements may add additional cost to the package fabrication. Present QFN package heat dissipation may be limited and may require additional space for heat sinking on the printed circuit board or substrate.

Thus, there is a need for improved package assembly methods. The present invention solves these and other problems by providing chip scale package assembly methods.

SUMMARY

Embodiments of the present invention improve fabrication methods of packaging semiconductors. In one embodiment the present invention includes a method of packaging semiconductor devices. The method comprises the steps of molding a first surface of a wafer, sawing the wafer, attaching, molding an exposed area, and sawing into individual packaged devices The step of molding includes molding a first surface of a wafer with a first mold compound. This forms a continuous molded layer. The step of sawing includes sawing the wafer into individual semiconductor devices. Each individual semiconductor device has a molded layer corresponding to a portion of the continuous molded layer. The step of attaching includes attaching the molded layer of the individual semiconductor devices to an adhesive surface. The step of molding includes molding an exposed area above the adhesive surface with a second mold compound. This forms a solid expanse of material. The step of sawing includes sawing the solid expanse of material. This forms a plurality of individual packaged semiconductor devices.

In one embodiment, the adhesive surface has a leadframe attached. The step of attaching the molded layer of the individual semiconductor devices to the adhesive surface includes placing the individual semiconductor devices within individual cavities of the leadframe.

In one embodiment, the method further comprises attaching a wire bond between a conductive pad of each individual semiconductor device to a conductive surface of a portion of a leadframe. The conductive surface corresponds to the conductive pad. The leadframe and the molded layer of the individual semiconductor device are attached to the adhesive surface.

In one embodiment, the step of molding an exposed area above the adhesive surface includes molding exposed areas of the individual semiconductor devices and a leadframe. A portion of the leadframe and a portion of the molded layer of the individual semiconductor devices are attached to the adhesive surface. Those portions remain unexposed.

In one embodiment, the first mold compound is the same as the second mold compound.

In one embodiment, portions of the second mold compound melds with portions of the first mold compound.

In one embodiment, portions of the second mold compound adheres with portions of the first mold compound.

In one embodiment, the invention includes a method of packaging semiconductor devices. The method comprises attaching a wafer, adding, sawing through the wafer, attaching devices, molding, and sawing to form a plurality of packaged semiconductor devices. The step of attaching includes attaching a first side of the wafer to a first adhesive surface. The step of adding includes adding a layer of metal to a second side of the wafer. The layer of metal forms a metalized surface of the wafer. The step of sawing the wafer includes sawing through a plurality of saw streets of the wafer. This establishes individual semiconductor devices. Each individual semiconductor device has a metalized surface corresponding to a portion of the metalized surface of the wafer. The step of attaching devices includes attaching the metalized surface of each of the individual semiconductor devices to a second adhesive surface. This makes the metalized surface unexposed. The step of molding includes molding an exposed area above the second adhesive surface. This forms a solid expanse of material. The step of sawing to form a plurality of packaged semiconductor devices includes sawing the solid expanse of material.

In one embodiment, the method further comprises sawing from the second side of the wafer. This establishes a notch. The step of adding the layer of metal forms a discernable channel within the notch. This provides surface details for alignment.

In one embodiment, the method further comprises sawing along the plurality of saw streets on the second side of a wafer prior to the sawing through the plurality of saw streets. This establishes a first cut having a height less than a thickness of the wafer.

In one embodiment, the step of sawing through the wafer creates a second cut having a width less than a width of the first cut. This forms a ledge.

In one embodiment, a leadframe tape includes the second adhesive surface. The leadframe tape has a leadframe attached. The step of attaching the metalized surface of each of the individual semiconductor devices to the second adhesive surface includes placing the individual semiconductor devices within individual cavities of the leadframe In one embodiment, the step of molding the exposed area includes molding exposed portions of the individual semiconductor devices and the leadframe. A portion of the leadframe and the metal surface of the individual semiconductor devices are attached to the second adhesive surface. Therefore these portions remain unexposed.

In one embodiment, the method further comprises re-taping the individual semiconductor devices after the step of sawing through a plurality of saw streets. The step of re-taping includes attaching the metalized surface of the wafer to a third adhesive surface after the sawing through the plurality of saw streets, and removing the first adhesive surface from the first side of the wafer.

In one embodiment, the step of attaching the metalized surface of each of the individual semiconductor devices includes picking the individual semiconductor devices from the third adhesive surface.

Additional embodiments will be evident from the following detailed description and accompanying drawings, which provide a better understanding of the nature and advantages of the present invention.

DETAILED DESCRIPTION

Described herein are techniques for performing thin QFN package fabrication methods. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include obvious modifications and equivalents of the features and concepts described herein.

Figure 1:
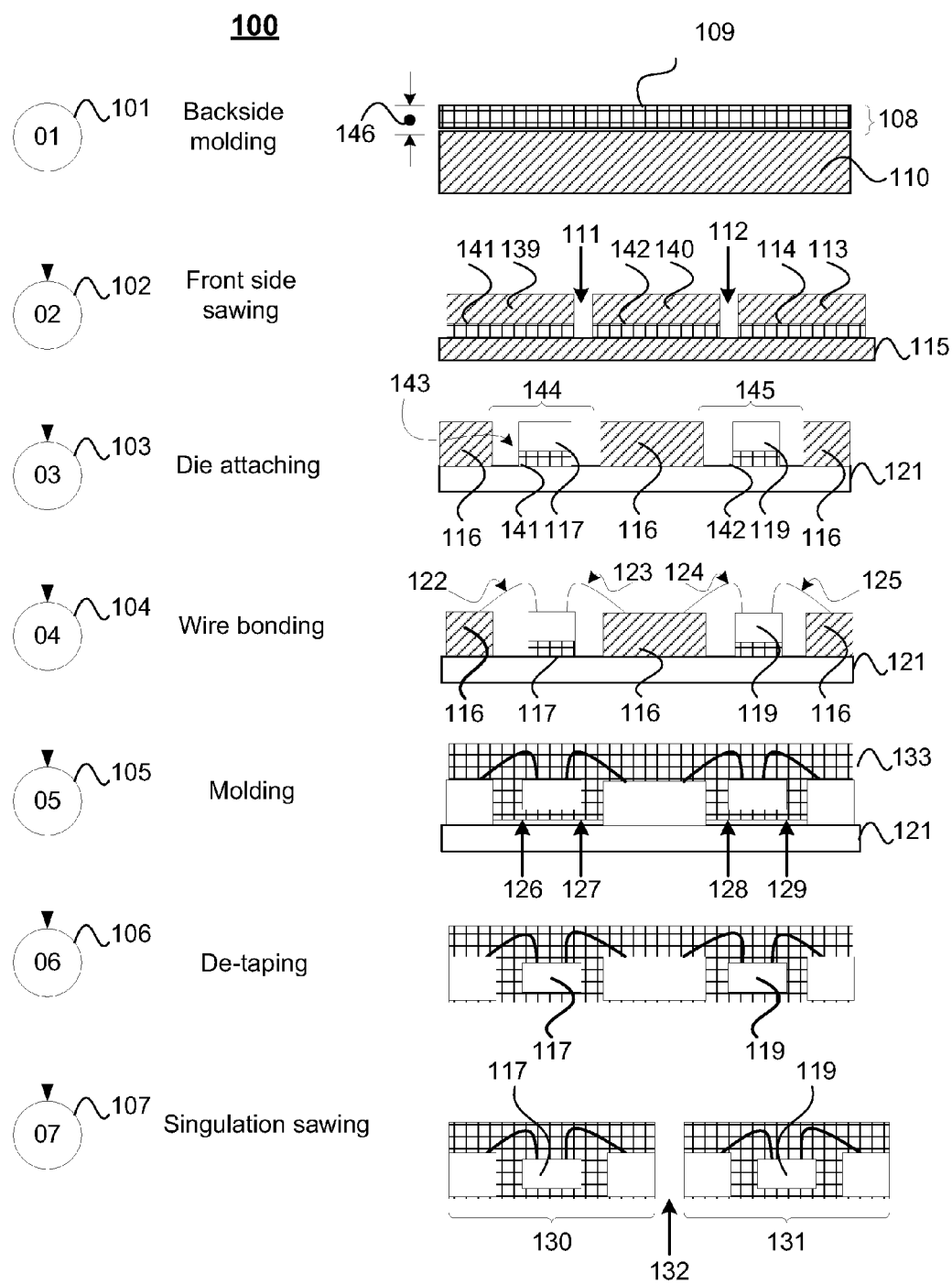
FIG. 1 illustrates a method of fabricating a thin QFN package and the corresponding cut away side views according to one embodiment of the present invention.

FIG. 1 illustrates a method 100 of fabricating a thin QFN package according to one embodiment of the present invention. The method 100 includes the steps of backside molding 101, front side sawing 102, die attaching 103, wire bonding 104, molding 105, de-taping 106, and singulation sawing 107.

The step of backside molding 101 includes adhering a mold compound 109 to the back side of the wafer 110. The molding 101 forms a continuous molded layer 108 having a thickness 146.

The step of front side sawing 102 cuts through the front side 137 of the wafer 110. This saws the wafer into individual devices (139, 140, and 113). Each individual semiconductor device (139, 140, and 113) has a molded layer (141, 142, and 114) corresponding to a portion of the continuous molded layer 108. The wafer may be attached to a tape 115 during the step of front side sawing 102, and the sawing may remove a portion of the tape 115.

The step of die attaching 103 includes attaching molded layer 141 of individual semiconductor device 117 to adhesive surface 143 of tape 121. Leadframe 116 may be already attached to the adhesive surface 143 of tape 121. The attaching the molded layer 141 of individual semiconductor device 117 may include placing the individual semiconductor device 117 within individual cavity 144 of the leadframe 116. Another individual semiconductor device 119 having a molded layer 142 attached to the adhesive surface 143 within an individual cavity 145 of the leadframe 116 is shown for clarity.

The step of wire bonding 104 includes connecting a wire 122 between a first conductive pad of individual semiconductor device 117 to a portion of a conductive surface of the leadframe 116 corresponding to the first conductive pad. Connected wires 123, 124, and 125 are shown for clarity. Wire 123 connects a second conductive pad of individual semiconductor device 117 to another portion of the conductive surface of the leadframe 116 corresponding to the second conductive pad. Wire 124 and 125 connect to the leadframe 116 and another individual die 119 in a manner similar to wire 122 and 123.

The step of molding 105 includes molding an exposed area above the adhesive surface 143 using mold compound 133. The molding 105 forms a solid expanse of material. The solid expanse of material may include mold compound 109, mold compound 133, the individual semiconductor devices (117, 119), and portions of the leadframe 116. The molding 105 of the exposed areas above the adhesive surface 143 may include molding exposed areas of the individual semiconductor devices (117 and 119) and leadframe 116. A portion of the leadframe 116 and a portion of the molded layer (141 and 142) of the individual semiconductor devices (117 and 119) are attached to the adhesive surface 143 of tape 121 and are therefore unexposed. Mold compound 109 may be the same as mold compound 133. Mold compound 133 may meld with previously exposed portions (126, 127) of mold compound 109 of the molded layer of the individual semiconductor device 117. Mold compound 133 may adhere with exposed portion of mold compound 109 of the individual semiconductor devices (117 and 199). Locations 126 and 127 are example regions around individual semiconductor device 117 in which the melding or the adhering may occur. Locations 128 and 129 are regions around another individual semiconductor device 119 and are shown for clarity.

The step of de-taping 106 removes the tape 121 used in the steps of die attaching 103, wire bonding 104, and molding 105. This step may or may not be required prior to the step of singulation sawing 107.

The step of singulation sawing 107 includes sawing through the wafer at location 132 between the devices (117 and 119) such that a plurality of chip scale packages are formed. Packaged device 130 and 131 are examples of the plurality of chip scale packages.

Figure 2:
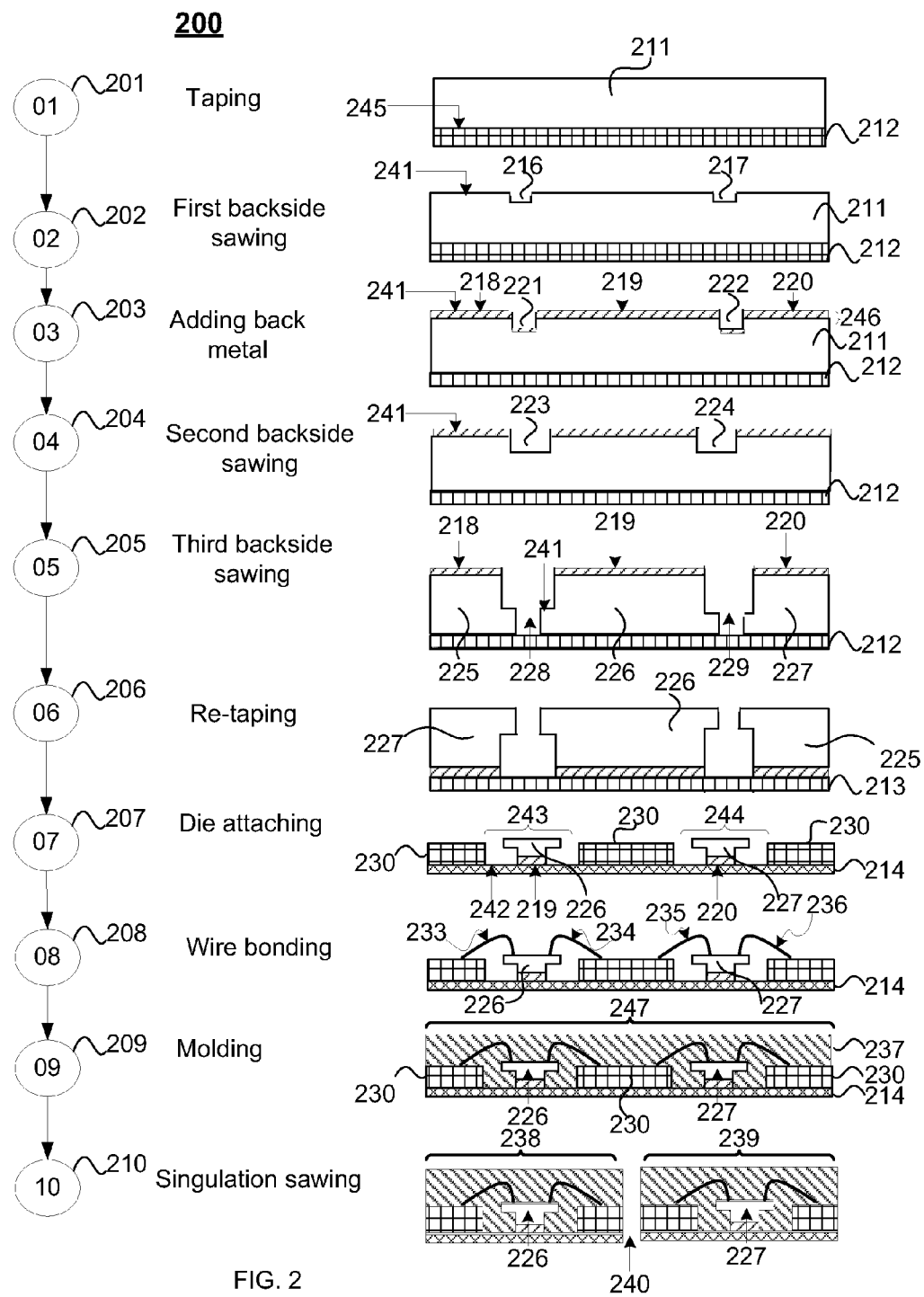
FIG. 2 illustrates another method of fabricating a thin QFN package according to another embodiment of the present invention.

FIG. 2 illustrates another method 200 of fabricating a QFN package according to another embodiment of the present invention. The method 200 includes the steps of taping 201, first backside sawing 202, adding back metal 203, second backside sawing 204, third backside sawing 205, re-taping 206, die attaching 207, wire bonding 208, molding 209, singulation sawing 210.

The step of taping 201 includes attaching the front side of wafer 211 to an adhesive surface of a tape 212. The tape 212 may be referred to as wafer tape.

The step of first backside sawing 202 includes sawing from the backside 241 of the wafer 211 and establishing a notch 216. Another notch 217 is shown for clarity. The sawing may be along a plurality of saw streets. The notch 216 adds surface detail to the backside of the wafer so that these details may be utilized for alignment after the step of adding back metal 203. The notch 216 is a cut having a width and height large enough to add the surface detail required for alignment after the step of adding back metal 203. The height and width of the required notch may be controlled by the attributes of the metallization such as thickness, for example.

The step of adding back metal 203 includes adding a layer of metal 246 (shown with angled hatched lines) to the backside 241 of the wafer 211. The layer of metal 246 forms a metalized surface 220 of the wafer 211. The layer of metal 246 forms a discernable channel 221 within notch 216. Another discernable channel 222 within notch 217 is shown for clarity.

The step of second backside sawing 204 includes sawing along a plurality of saw streets on the back side 241 of the wafer 211. The second backside sawing 204 results in a cut 223 which has a height and a width. Another cut 224 is shown for clarity. The cut 223 may be centered on notch 216 such that cut 223 replaces notch 216. For example, cut 223 may have a larger width and height than notch 216. Cut 223 may have a height that is greater than notch 216 but less than the thickness of the entire composite wafer, including metal, so that the cut does not penetrate the entire wafer. The step of second backside sawing 204 may include aligning the wafer according to the discernable channel (e.g., 221, 222) prior to applying the saw to the wafer 211.

The step of third backside sawing 205 includes sawing through a plurality of saw streets on the back side 241 of the wafer 211. This establishes individual semiconductor devices (225, 226, and 227) each having a metalized surface corresponding to a portion of the metalized surface (218, 219, 220) of the wafer 211. The step of third backside sawing 205 results in cut 228. Another cut 229 is shown for clarity. Cut 228 may have a width narrower than the width of cut 223. A difference of the widths of cut 228 and cut 223 may form a ledge 241. This ledge 241 may aid in securing the semiconductor device 226 within the package after the step of molding 209. The step of third backside sawing 205 may cut into a portion of the width of the wafer tape 212, for example, but not through the entire tape thickness.

The step of re-taping 206 includes attaching the metalized surface (e.g., 218, 219, 220) to an adhesive surface of tape 213 and removing the wafer tape 212 from the front side of the wafer. This step provides corresponding spacing between individual semiconductor devices (225, 226, 227) on the wafer tape 212 and the individual semiconductor devices (227, 226, 225) on tape 213 in preparation for the step of die attaching 207.

The step of die attaching 207 includes attaching the metalized surface 219 of the individual semiconductor device 226 to an adhesive surface 242 of tape 214. The individual semiconductor device may have been picked from an array of devices attached to tape 213 and then placed onto tape 214. Tape 214 may be a leadframe tape in which a leadframe 230 is already attached to the adhesive surface 242. The attaching the metalized surface 219 of the individual semiconductor device 226 to an adhesive surface 242 includes placing the individual semiconductor device 226 within an individual cavity 243 of the leadframe 230. Another individual semiconductor device 227 with a metalized surface 220 attached to the adhesive surface 242 in another individual cavity 244 of the leadframe 230 is shown for clarity.

The step of wire bonding 208 is similar to that discussed in step 104 of method 100. Reference numbers 117, 119, 122, 123, 124, and 125 of FIG. 1 correspond to reference numbers 226, 227, 233, 234, 235, and 236 of FIG. 2 respectively.

The step of molding 209 includes molding an exposed area above the adhesive surface 242 using mold compound 237. The molding 209 forms a solid expanse of material 247. The solid expanse of material 247 may include mold compound 237, portions of the layer of metal 246, the individual semiconductor devices (e.g., 226, 227), and portions of the leadframe 230. The molding 209 the exposed areas above the adhesive surface 242 may include molding exposed areas of the individual semiconductor devices (226 and 227) and leadframe 230. A portion of the leadframe 230 and a portion of the metalized surface (219 and 220) of the individual semiconductor devices (226 and 227) are attached to the adhesive surface 242 and are therefore unexposed. The ledge 241 may help to secure the individual semiconductor device 226 within the mold compound 237.

The step of singulation saw 210 includes sawing through the wafer at location 240 between the devices (226 and 227) such that a plurality of chip scale packages are formed. Packaged device 238 and 239 are example elements of the plurality of chip scale packages.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, switching systems and methods with current sensing according to the present invention may include some or all of the innovative features described above. Based on the above disclosure and the following claims, other arrangements, embodiments, implementations and equivalents will be evident to those skilled in the art and may be employed without departing from the spirit and scope of the invention as defined by the claims.

What is claimed is:

1. A method of packaging semiconductor devices comprising:
   attaching a first side of a wafer to a first adhesive surface;
   adding a layer of metal to a second side of the wafer, the layer of metal forming a metalized surface of the wafer;
   sawing through a plurality of saw streets of the wafer, and in accordance therewith, establishing individual semiconductor devices, each individual semiconductor device having a metalized surface corresponding to a portion of the metalized surface of the wafer;
   re-taping the individual semiconductor devices after sawing through a plurality of saw streets, the re-taping includes,
      attaching the metalized surface of the wafer to a second adhesive surface after the sawing through the plurality of saw streets, and
      removing the first adhesive surface from the first side of the wafer,
   attaching the metalized surface of each of the individual semiconductor devices to a third adhesive surface, and in accordance therewith, making the metalized surface unexposed, wherein the attaching the metalized surface of each of the individual semiconductor devices includes picking the individual semiconductor devices from the second adhesive surface;
   molding an exposed area above the third adhesive surface, forming a solid expanse of material; and
   sawing the solid expanse of material resulting in a plurality of packaged semiconductor devices.

2. The method of claim 1 wherein a wafer tape includes the first adhesive surface, the wafer tape having a thickness,
   wherein the sawing through a plurality of saw streets of the wafer includes sawing at least partially through the thickness of the wafer tape.

3. The method of claim 1 wherein a leadframe tape includes the third adhesive surface, the leadframe tape having a leadframe attached,
   wherein the attaching the metalized surface of each of the individual semiconductor devices to a third adhesive surface includes placing the individual semiconductor devices within individual cavities of the leadframe.

4. The method of claim 3 wherein the molding an exposed area includes molding exposed portions of the individual semiconductor devices and the leadframe,
wherein a portion of the leadframe and the metal surface of the individual semiconductor devices are attached to the third adhesive surface, and in accordance therewith, said attached portions remain unexposed.

5. The method of claim 1 further comprising attaching a wire bond between a conductive pad of each individual semiconductor device to a conductive surface of a corresponding portion of a leadframe,
wherein the leadframe and the metalized surface of the individual semiconductor device are attached to the third adhesive surface.

6. The method of claim 1 wherein sawing through the plurality of saw streets of the wafer establishes a first cut and a second cut.

7. The method of claim 6, wherein:
the first cut is of a first height and first width,
the second cut of a second height and second width, and
the second width is larger than the first width.

8. The method of claim 6, wherein said sawing through the plurality of saw streets of the wafer further establishes a third cut having a first width less than a second width of the second cut.

9. The method of claim 1, wherein the third adhesive surface is attached to a first surface of a lead frame and the metalized surface of the molded layer of the individual semiconductor devices during molding of the exposed layer.

* * * * *